(12) United States Patent
Zhang et al.

(10) Patent No.: US 11,488,883 B1
(45) Date of Patent: Nov. 1, 2022

(54) SEMICONDUCTOR DEVICE PACKAGE HAVING THERMALLY CONDUCTIVE LAYERS FOR HEAT DISSIPATION

(71) Applicant: Western Digital Technologies, Inc., San Jose, CA (US)

(72) Inventors: Yazhou Zhang, Shanghai (CN); Jiandi Du, Shanghai (CN); Hope Chiu, Shanghai (CN); Cong Zhang, Shanghai (CN); Fen Yu, Shanghai (CN); Ada Shen, Shanghai (CN); Gary Zheng, Shanghai (CN); Honny Chen, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/229,429

(22) Filed: Apr. 13, 2021

(51) Int. Cl.
*H01L 23/36* (2006.01)
*H01L 25/065* (2006.01)
*H01L 23/31* (2006.01)
*H01L 23/16* (2006.01)
*G11C 5/06* (2006.01)

(52) U.S. Cl.
CPC ............... *H01L 23/36* (2013.01); *G11C 5/06* (2013.01); *H01L 23/16* (2013.01); *H01L 23/31* (2013.01); *H01L 25/0657* (2013.01)

(58) Field of Classification Search
CPC ......... H01L 23/36; H01L 23/16; H01L 23/31; H01L 25/0657; G11C 5/06
See application file for complete search history.

(56) References Cited

U.S. PATENT DOCUMENTS

| | | | |
|---|---|---|---|
| 7,317,247 B2 | 1/2008 | Lee et al. | |
| 2013/0299961 A1* | 11/2013 | Chen | H01L 23/49827 257/706 |
| 2014/0063742 A1 | 3/2014 | Carpenter, Jr. et al. | |
| 2020/0091129 A1* | 3/2020 | Fujimaki | H01L 25/18 |
| 2020/0135710 A1* | 4/2020 | Kim | H01L 23/3135 |
| 2020/0185290 A1* | 6/2020 | Padmanabhan Ramalekshmi Thanu | H01L 23/3675 |

* cited by examiner

*Primary Examiner* — Peniel M Gumedzoe
(74) *Attorney, Agent, or Firm* — Morgan, Lewis & Bockius LLP

(57) ABSTRACT

A semiconductor device package includes a substrate, a heat-generating component positioned on a surface of the substrate, and an encapsulant at least partially covering the heat-generating component and having an outer surface. A first heat-conducting layer is disposed between the encapsulant and the first heat-generating component. One or more pillars are in contact with the first heat-conducting layer and extend to the outer surface of the encapsulant and contact a second heat-conducting layer disposed on the outer surface of the encapsulant.

20 Claims, 7 Drawing Sheets

SEMICONDUCTOR DEVICE PACKAGE HAVING THERMALLY CONDUCTIVE LAYERS FOR HEAT DISSIPATION

BACKGROUND

The present disclosure relates to semiconductor device packaging, and more particularly to a semiconductor device package having one or more thermally conductive layers.

Encapsulants are materials that are utilized to encapsulate and protect an integrated circuit (IC) die and/or other components of a packaged semiconductor device. Encapsulants may include, for example, ceramic, glass, thermoplastic materials, thermoset resins, or composites thereof. Some commonly used encapsulants include epoxy mold compounds (EMCs) that typically contain a mixture of epoxy resins and one or more additives (e.g., curing agents, hardeners, accelerators, fillers, flame retardants, adhesion promoters, and/or pigments). The encapsulant may be applied, for example, by melting a quantity of the encapsulant and injecting the liquefied material into a mold cavity that surrounds the IC die and/or other components to be encapsulated. The liquefied material is allowed to cover the components and is then cured or hardened around the components.

Encapsulants may have relatively low thermal conductivity, resulting in poor transmission of heat from the encapsulated components. For example, some EMC materials may have a thermal conductivity of about 1.0 W/m·K or lower. Accordingly, excess heat generated by the IC die and other electronic components of the semiconductor device may not be effectively dissipated, decreasing reliability of the semiconductor device and possibly resulting in premature failure. It would therefore be advantageous to have a semiconductor device package with improved thermal dissipation.

SUMMARY

The present disclosure, according to some embodiments, provides a semiconductor device package with one or more thermally conductive layers and methods for making the same. In some embodiments, the semiconductor device package includes one or more thermally conductive layers in thermal communication with a heat-generating component (e.g., IC die, NAND die, etc.). In some embodiments, during use, heat is dissipated from the heat-generating component toward a surface of the semiconductor device package and/or the surrounding environment via the one or more thermally conductive layers. In some embodiments, the one or more thermally conductive layers may be, at least partially, surrounded by an encapsulant. In some embodiments, a thermally conductive layer is disposed on one or more outer surfaces of the encapsulant and is configured to facilitate heat dissipation to the environment surrounding the semiconductor device package. In some embodiments, the semiconductor device package includes one or more thermally conductive elements configured to conduct heat from the heat-generating component to a thermally conductive layer disposed on an outer surface of the encapsulant. In further embodiments, heat may also be transferred from the heat-generating component to a substrate (e.g., printed circuit board).

A semiconductor device package according to some embodiments includes a substrate, a heat-generating component positioned on a surface of the substrate, an encapsulant at least partially covering the heat-generating component and having an outer surface, a first heat-conducting layer disposed between the encapsulant and the first heat-generating component, and one or more pillars in contact with the first heat-conducting layer. The heat-generating component may be, for example, an IC die, NAND die, or other chip, and the substrate may be a circuit board. In some embodiments, the one or more pillars may extend to the outer surface of the encapsulant and contact a second heat-conducting layer disposed on the outer surface. In such some embodiments, at least a portion of the encapsulant is disposed between the first heat-conducting layer and the second heat-conducting layer. In some embodiments, the one or more pillars extend through the encapsulant from the first heat-conducting layer to the second heat-conducting layer. In some embodiments, the one or more pillars are positioned on the substrate and spaced from the heat-generating component. In some embodiments, an underfill material is disposed on the substrate between the one or more pillars and the heat-generating component, and the first heat-conducting layer is disposed between the underfill material and the encapsulant. In some embodiments, the first heat-conducting layer is disposed directly on a surface of the heat-generating component (e.g., via sputtering or other deposition method). For example, in some embodiments, the heat-generating component is an IC die having an active side facing the substrate and a back side opposite the active side, and the first heat-conducting layer is disposed directly on the back side of the IC die.

In some embodiments, the first heat-conducting layer, the second heat-conducting layer, and the one or more pillars each comprises a material having a thermal conductivity that is greater than the thermal conductivity of the encapsulant. The material may have, for example, a thermal conductivity that is at least 147 W/m·K, for example, from about 300 W/m·K to about 600 W/m·K. The material may be, for example, copper, aluminum, or other metal or alloy. In some embodiments, the first heat-conducting layer may be formed by sputtering a layer of copper or other thermally conductive material onto the heat-generating component and underfill prior to encapsulation with the encapsulant. In some embodiments, the second heat-conducting layer may be formed by sputtering a second layer of copper or other thermally conductive material onto the outer surface of the encapsulant.

In a further embodiment, a semiconductor device package includes a substrate, a first heat-generating component positioned on a surface of the substrate, one or more second heat-generating components positioned adjacent to the first heat-generating component, an encapsulant at least partially covering the first and the one or more second heat-generating components and having an outer surface, a heat-conducting layer disposed on the outer surface of the encapsulant, and a first heat-conducting spacer positioned on the back side of the first heat-generating component. In some embodiments, the heat-conducting layer is disposed on a top and one or more lateral side surfaces of the outer surface of the encapsulant. In some embodiments, the one or more second heat-generating components are at least partially positioned on a back side of the first heat-generating component. In some embodiments, the first heat-conducting spacer extends to the outer surface of the encapsulant and contacts the heat-conducting layer. In some embodiments, the semiconductor device package includes a second heat-conducting spacer positioned on the one or more second heat-generating components, which may also extend to the outer surface of the encapsulant and contact the heat-conducting layer. In some embodiments, the second heat-conducting spacer is positioned between the one or more second heat-generating components and the encapsulant. The first heat-conducting spacer and/or the second heat-conducting spacer may be made of silicon, in some examples, while the heat-conducting layer may be made of copper or copper alloy. In some embodiments, the heat-conducting layer is disposed on a top surface of the encapsulant and one or more lateral sides of the encapsulant. In some embodiments, the heat-conducting layer extends to the substrate. In some embodiments, the substrate includes thermally conductive traces, at least one of which is in contact with the heat-conducting layer. In some such embodiments, heat may be transferred from the heat-generating to the substrate, and in turn, conducted by the thermally conductive traces to the heat-conducting layer. In some embodiments, the first heat-generating component comprises a control die and the one or more second heat-generating components comprise one or more NAND dies. The one or more NAND dies may be stacked one upon another. In some embodiments, the control die is in communication with the one or more NAND dies by way of the substrate.

BRIEF DESCRIPTION OF THE DRAWINGS

The foregoing summary, as well as the following detailed description, will be better understood when read in conjunction with the appended drawings. For the purpose of illustrating the present disclosure, there are shown in the drawings embodiments which are presently preferred, wherein like reference numerals indicate like elements throughout. It should be noted, however, that aspects of the present disclosure can be embodied in different forms and thus should not be construed as being limited to the illustrated embodiments set forth herein. The elements illustrated in the accompanying drawings are not necessarily drawn to scale, but rather, may have been exaggerated to highlight the important features of the subject matter therein. Furthermore, the drawings may have been simplified by omitting elements that are not necessarily needed for the understanding of the disclosed embodiments.

DETAILED DESCRIPTION

The present subject matter will now be described more fully hereinafter with reference to the accompanying Figures, in which representative embodiments are shown. The present subject matter can, however, be embodied in different forms and should not be construed as limited to the embodiments set forth herein. Rather, these embodiments are provided to describe and enable one of skill in the art.

Figure 1:
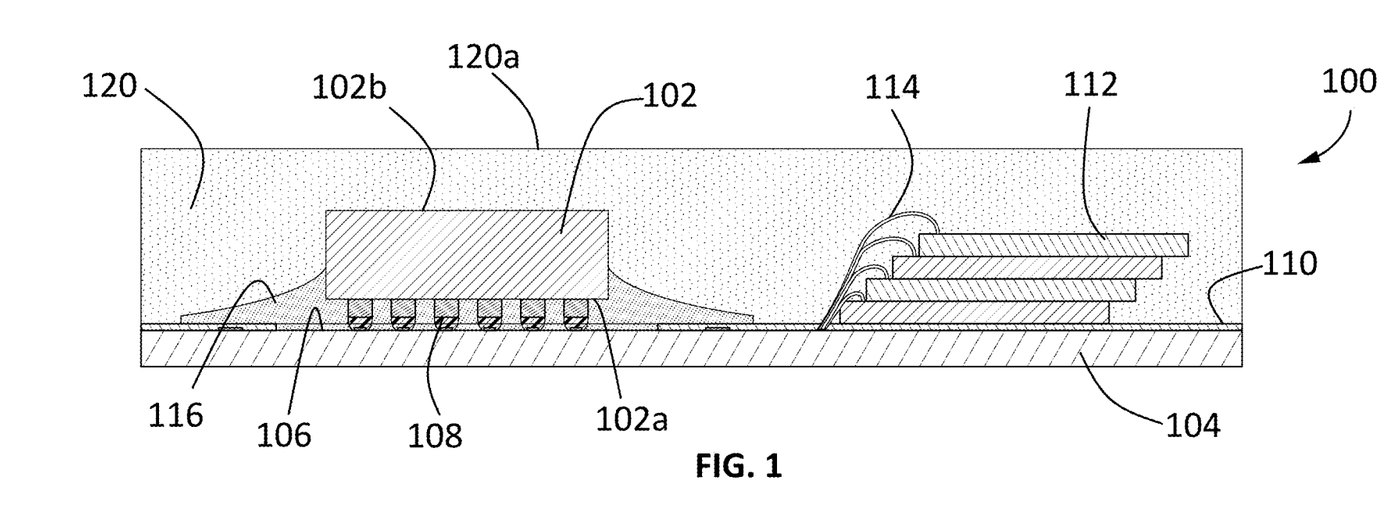
FIG. 1 is an enlarged cross-sectional side view of a portion of a conventional semiconductor memory device package having an IC die positioned on a substrate and covered by an encapsulant.

FIG. 1 is a diagram illustrating a portion of a conventional semiconductor device package. Semiconductor device package 100 includes, for example, an IC die 102 (e.g., a flip-chip die) that is positioned on a surface 106 of substrate 104. IC die 102 may be, for example, an application-specific integrated circuit (ASIC) die, in some embodiments. In some embodiments, IC die 102 is a control die. IC die 102 may include an active side 102*a* that is positioned to face substrate 104, and a back side 102*b* that is opposite of active side 102*a* and faces away from substrate 104. Substrate 104 may be a circuit board (e.g., PCB) having external circuitry to which active side 102*a* of IC die 102 is electrically connected, for example, via one or more solder joints 108. In some examples, substrate 104 may include a solder mask 110 on surface 106. Semiconductor device package 100 may include further components, for example, one or more NAND dies 112 or other memory chips. The one or more NAND dies 112 or other memory chips may be electrically connected to electrical contacts (e.g., gold fingers) via connecting wires 114, for example, and be configured to send/receive signals to/from IC die 102. In some embodiments, particularly where IC die 102 is a flip-chip die, semiconductor device package 100 further includes an underfill material 116 that is configured to adhere IC die 102 to substrate 104. Underfill material 116, for example, may be an electrically insulating material (e.g., resin) that fills a space between IC die 102 and substrate 104 and may form a fillet that surrounds IC die 102.

As further illustrated in FIG. 1, one or more components of semiconductor device package 100 are encapsulated by an encapsulant 120, which helps protect the one or more components. Encapsulant 120 may include, for example, a ceramic, glass, thermoplastic, thermoset resin, or composite thereof. In some examples, encapsulant is an EMC or other encapsulating material that is molded around IC die 102 and/or NAND dies 112. Encapsulant 120, in some embodiments, further surrounds underfill material 116, solder mask 110, and/or other components on substrate 104.

During operation, electronic components of semiconductor device package 100 generate heat. These heat-generating components can include, for example, IC die 102, NAND dies 112, and any other semiconductor integrated circuits of semiconductor device package 100. As discussed, encapsulant 120 may have a relatively low thermal conductivity (e.g., less than 10 W/m·K), and therefore dissipation of excess heat away from the heat-generating components may be poor or inefficient. For example, in some instances, only about 10% to about 20% of the heat generated by IC die 102 may dissipate through top surface 120*a* of encapsulant 120.

Figure 2:
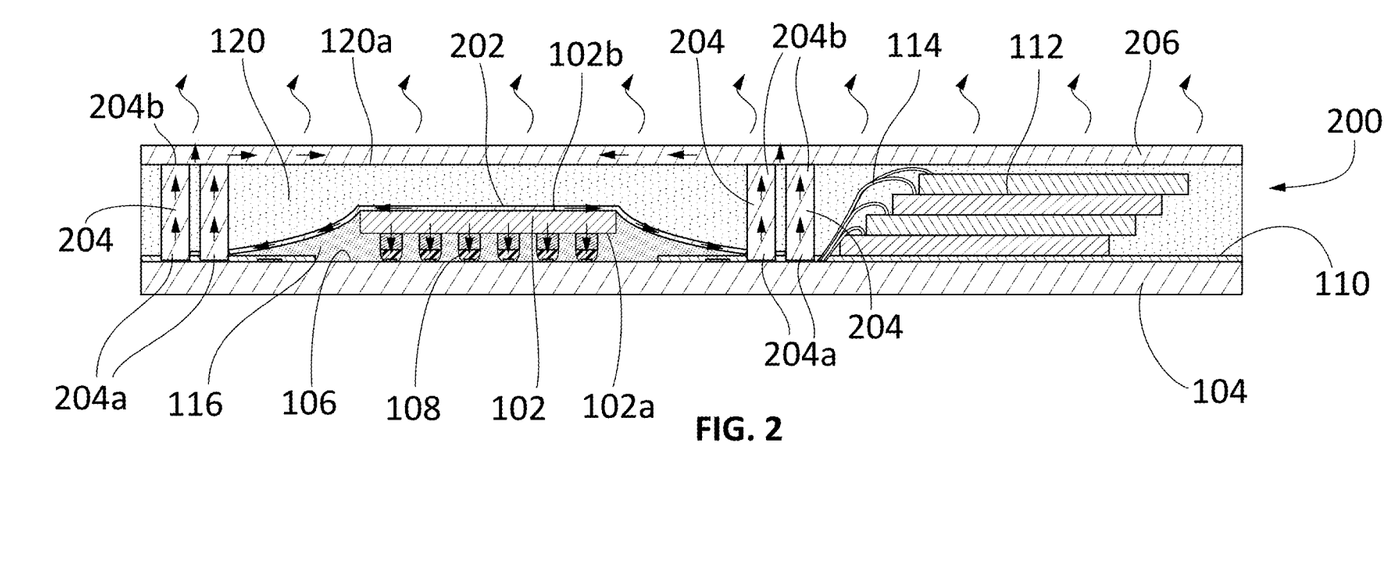
FIG. 2 is an enlarged cross-sectional side view of a portion of a semiconductor device package according to certain embodiments of the present disclosure having thermally conductive layers for dissipating heat from a heat-generating component.

FIG. 2 illustrates a semiconductor device package 200 according to certain embodiments of the present disclosure that is configured to provide improved heat dissipation over semiconductor device package 100. Semiconductor device package 200, in some embodiments, may have certain components that are similar to components of semiconductor device package 100. For example, in certain embodiments semiconductor device package 200 includes at least one heat-generating component, e.g., IC die 102 (e.g., a flip-chip die), one or more NAND dies 112, and/or other chips, that are positioned on substrate 104. IC die 102, for example, may be an ASIC die and is configured to send/receive signals to/from NAND dies 112. IC die 102 may include an active side 102*a* that is positioned to face substrate 104, and a back side 102*b* that is opposite of active side 102*a* and faces away from substrate 104. Semiconductor device package 200 further includes an encapsulant 120 that at least partially surrounds the one or more heat-generating components. In some embodiments, semiconductor device package 200 may further include solder mask 110, underfill material 116 that is configured to adhere IC die 102 to surface 106 of substrate 104, and connecting wires 114 for connecting NAND dies 112 to electrical contacts (e.g., gold fingers). In these aspects, semiconductor device package 200 may be similarly configured as semiconductor device package 100 according to some embodiments.

In some embodiments, semiconductor device package 200 further includes a first heat-conducting layer 202. In some embodiments, first heat-conducting layer 202 is disposed between a heat-generating component (e.g., IC die 102) and encapsulant 120. In some embodiments, first heat-conducting layer 202 physically separates the heat-generating component from encapsulant 120. In some embodiments, first heat-conducting layer 202 is in thermal contact with the heat-generating component and is configured to conduct heat away from the heat-generating component during use. For example, first heat-conducting layer 202 may be in direct contact with at least back side 102b of IC die 102 and is configured to conduct heat away from IC die 102. In some embodiments, first heat-conducting layer 202 covers at least or greater than 50% of the surface area of back side 102b, preferably the entire back side 102b of IC die 102. As illustrated, in some embodiments, first heat-conducting layer 202 further extends over at least a portion of underfill 116 that surrounds IC die 102. In some embodiments, first heat-conducting layer 202 extends over all of underfill 116 that surrounds IC die 102. First heat-conducting layer 202 may have a contour that generally matches the contour of IC die 102 and underfill 116. In some such embodiments, first heat-conducting layer 202 is disposed between the portion of underfill 116 and encapsulant 120. In some embodiments, first heat-conducting layer may have a thickness selected from about 1 µm to about 20 µm, for example, at least 3 µm to 10 µm. In other embodiments, the thickness of first heat-conducting layer 202 may range from about 10 µm to about 500 µm. In some embodiments, the thickness of first heat-conducting layer 202 may be substantially constant. In some embodiments, the thickness of first heat-conducting layer 202 may be different at different portions of first heat-conducting layer 202. As will be described further below, in some embodiments, first heat-conducting layer 202 may be formed by sputtering a thermally conductive material over IC die 102 and underfill 116. Other physical or chemical vapor deposition processes may also be used to form first heat-conducting layer 202.

In some embodiments, first heat-conducting layer 202 extends to and is in thermal contact with one or more pillars 204. In some embodiments, the one or more pillars 204 are positioned and configured to conduct heat from first heat-conducting layer 202 toward an outer surface of encapsulant 120, e.g., top surface 120a of encapsulant 120. In some embodiments, each of the one or more pillars 204 may include a first end 204a in contact with first heat-conducting layer 202, and a second end 204b that extends to top surface 120a of encapsulant 120. In some embodiments, first end 204a are attached to substrate 104. In some embodiments, the one or more pillars 204 are positioned on substrate 104 and may be spaced away from the heat-generating component. For example, in some embodiments, the one or more pillars 204 are positioned around IC die 102 and spaced away from IC die 102 by at least the fillet formed by underfill 116. In some embodiments, the one or more pillars 204 may be spaced away from an edge of underfill 116, for example, by a distance of about 900 µm to about 5 mm. The one or more pillars 204, in some embodiments, may extend generally perpendicular to surface 106 of substrate 104. In some embodiments, the heat generating component (e.g., IC die 102) may be positioned between two or more pillars 204, for example, centrally positioned between the two or more pillars 204. In some embodiments, a plurality of pillars 204 are positioned around the heat generating component. In some embodiments, each of the plurality pillars 204 may have the same size and shape. In other embodiments, the plurality of pillars 204 includes pillars having different sizes and/or shapes. In some embodiments, one or more of pillars 204 may have a cylindrical shape having, for example, a height from about 20 µm to about 200 µm and a diameter from about 30 µm to about 500 µm. In some embodiments, pillars 204 may be evenly spaced and have a pitch that is at least one to two times the diameter.

In further embodiments, semiconductor device package 200 includes a second heat-conducting layer 206. In some embodiments, second heat-conducting layer 206 is positioned and configured to dissipate heat to the environment surrounding semiconductor device package 200. In some such embodiments, second heat-conducting layer 206 may have one or more surfaces that are exposed to the surrounding environment. In some embodiments, second heat-conducting layer 206 is disposed on an outer surface of encapsulant 120, for example, top surface 120a of encapsulant 120. In some embodiments, a majority (e.g., at least 50%) of top surface 120a of encapsulant 120 is covered by second heat-conducting layer 206. In some embodiments, the entirety of top surface 120a of encapsulant 120 is covered by second heat-conducting layer 206. Second heat-conducting layer 206 may also be disposed along one or more lateral sides of encapsulant 120. In some embodiments, second heat-conducting layer 206 may be formed by sputtering a thermally conductive material over an outer surface of encapsulant 120, for example, top surface 120a. Other physical or chemical vapor deposition processes may also be used to form second heat-conducting layer 206. In some embodiments, second heat-conducting layer 206 has a thickness that is greater than a thickness of first heat-conducting layer 202. In some examples, the thickness of second heat-conducting layer 206 may range from about 50 µm to about 1000 µm.

In some arrangements, at least a portion of encapsulant 120 is disposed between first heat-conducting layer 202 and second heat-conducting layer 206. In some embodiments, second heat-conducting layer 206 extends over the one or more pillars 204 such that the second ends 204b of the one or more pillars 204 are in direct contact with second heat-conducting layer 206. Thus, in some embodiments, the one or more pillars 204 are in contact with both first heat-conducting layer 202 and second heat-conducting layer 206 and provide thermal pathways for heat to be conducted from first heat-conducting layer 202 to second heat-conducting layer 206.

In some embodiments, first heat-conducting layer 202, second heat-conducting layer 206, and the one or more pillars 204 together form a passive, first thermal pathway to quickly dissipate heat away from the IC die 102 to the outside environment. In some embodiments, this first thermal pathway may be particularly configured to conduct heat away from back side 102a of IC die 102. The direction of heat transfer according to some embodiments is represented by the arrows shown in FIG. 2. During operation of semiconductor device package 200, for example, at least a portion of heat generated by IC die 102 may exit IC die 102 through back side 102b. This heat may be transferred to first heat-conducting layer 202, which in some embodiments is disposed over and in direct contact with at least a portion of back side 102b. The heat transferred to first heat-conducting layer 202 may in turn be conducted first heat-conducting layer 202 to the one or more pillars 204 that may be positioned on substrate 104 around IC die 102. These one or more pillars 204 conduct heat through encapsulant 120 to second heat-conducting layer 206. As discussed previously, in some embodiments, second heat-conducting layer 206 is disposed over at least a portion of an outer surface of encapsulant 120, for example, top surface 120a, and is exposed to the environment surrounding semiconductor device 200. In some such embodiments, heat conducted to second heat-conducting layer 206 by the one or more pillars 204 may then exit to the surrounding environment.

In some embodiments, at least a portion of the heat generated by IC die 102 may also be transferred to substrate 104 in a second thermal pathway. In some such embodiments, for example, heat may be transferred to substrate 104 from IC die 102 through the one or more solder joints 108 that connect IC die 102 to substrate 104. In some such embodiments, this passive, second thermal pathway is configured to conduct heat away from active side 102a of IC die 102. In some embodiments, substrate 104 may include thermally conductive traces (not shown) for conducting heat received from IC die 102. In some embodiments, at least a portion of heat transferred to substrate 104 from IC die 102 may in turn be transferred to the one or more pillars 204 positioned on substrate 104 and conducted to second heat-conducting layer 206.

First heat-conducting layer 202, second heat-conducting layer 206, and the one or more pillars 204 may be made from one or more thermally conductive materials selected to have a thermal conductivity that is greater than the thermally conductivity of encapsulant 120. First heat-conducting layer 202, second heat-conducting layer 206, and the one or more pillars 204 may be made from the same thermally conductive material or each may be made from different thermally conductive materials. In some embodiments, the one or more thermally conductive materials that are used in first heat-conducting layer 202, second heat-conducting layer 206, and/or the one or more pillars 204 may be selected to have a thermal conductivity that is at least 10 to at least 100 times greater than the thermally conductivity of encapsulant 120, preferably at least 100 to at least 500 times greater than the thermally conductivity of encapsulant 120. For example, in some embodiments, encapsulant 120 may have a thermal conductivity of less than 1 W/m·K to about 10 W/m·K, whereas the one or more thermally conductive materials of first heat-conducting layer 202, second heat-conducting layer 206, and the one or more pillars 204 may have a thermal conductivity at least or greater than the thermal conductivity of pure silicon, which is approximately 147 W/m·K. In some embodiments, First heat-conducting layer 202, second heat-conducting layer 206, and the one or more pillars 204 may be made from one or more thermally conductive materials that have a thermal conductivity within a range of about 100 W/m·K to about 600 W/m·K, for example, about 300 W/m·K to about 500 W/m·K.

In some embodiments, the one or more thermally conductive materials includes or consists of a pure metal or metal alloy. In some embodiments, the one or more thermally conductive materials includes or consists of pure copper or a copper alloy, for example. The copper or copper alloy may have a thermal conductivity greater than 300 W/m·K (e.g., about 397 W/m·K). In some embodiments, the one or more thermally conductive materials includes or consists of aluminum or an aluminum alloy. In some embodiments, the one or more thermally conductive materials includes or consists of a precious metal or alloy thereof (e.g., silver or gold). In some embodiments, the one or more thermally conductive materials includes or consists of silicon. In other embodiments the one or more thermally conductive materials includes or consists of a non-metallic material preferably having a thermal conductivity that is at least or greater than 100 W/m·K. In some embodiments, the one or more thermally conductive materials includes or consists of graphene, carbon nanotubes, diamond, and/or other forms of carbon.

Figure 3A:
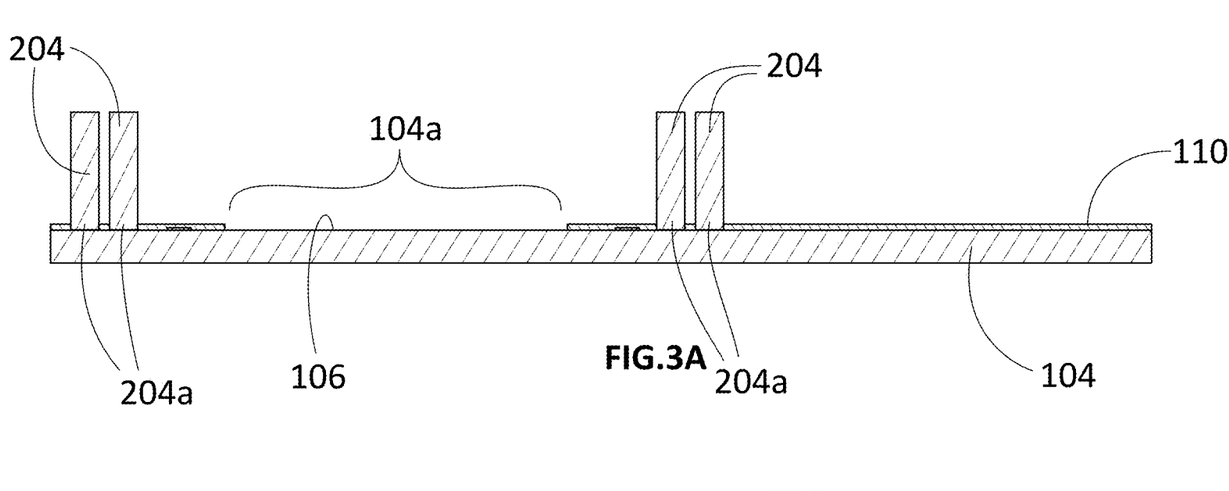
FIGS. 3A-3J are enlarged cross-sectional side views illustrating steps for assembling a semiconductor device package according to certain embodiments of the present disclosure.

FIGS. 3A-3J illustrate steps for assembling semiconductor device package 200, according to certain exemplary embodiments. As shown in FIG. 3A, in some embodiments a substrate 104 (e.g., a PCB) is provided that includes a die attachment area 104a on surface 106. Die attachment area 104a may be sized and configured to receive a die, for example, IC die 102. In some embodiments, substrate 104 may include a solder mask 110 disposed over a portion of surface 106 around die attachment area 104a. As further shown in FIG. 3A, one or more pillars 204 are positioned on and affixed to substrate 104. In some embodiments, pillars 204 are positioned around die attachment area 104 and each pillar 204 may extend generally perpendicular to surface 106 of substrate 104. In some embodiments, pillars 204 are attached to substrate 104 using a surface-mount technology (SMT) process. For example, in some embodiments, each pillar 204 includes first end 204a that is mounted onto substrate 104 using solder.

Figure 3B:
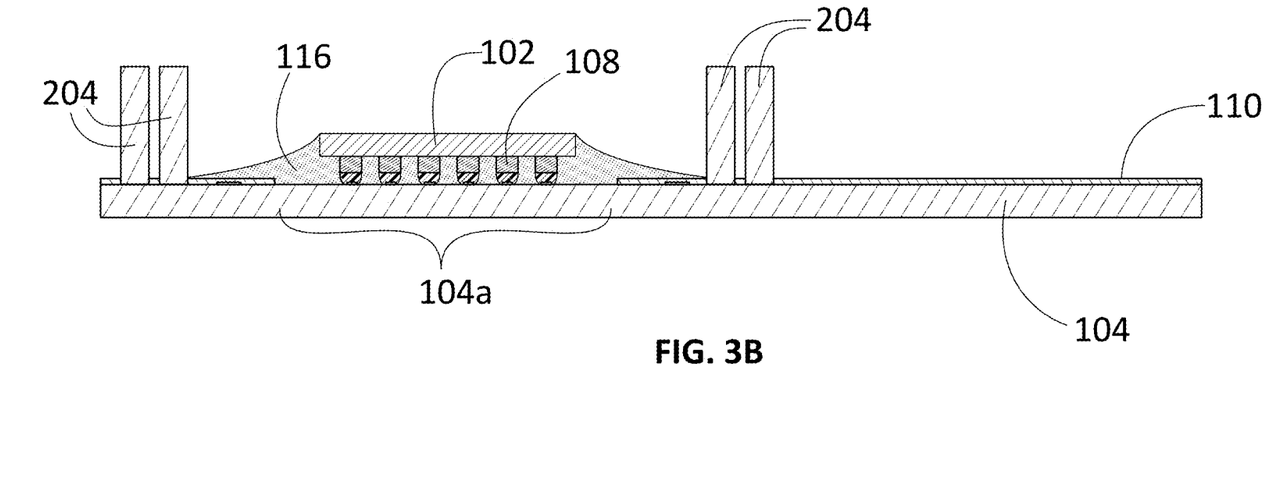

As shown in FIG. 3B, IC die 102 is mounted to die attachment area 104a of substrate 104. In some embodiments, IC die 102 may be mounted to substrate 104 after pillars 204 have been mounted to substrate 104. In other embodiments, IC die 102 may be mounted to substrate 104 prior to mounting pillars 204 to substrate 104. In some embodiments, IC die 102 is mounted to substrate 104 using one or more solder joints 108 that electrically connect IC die 102 to circuitry (not shown) on substrate 104. In further embodiments, an underfill 116 is introduced between IC die 102 and substrate 104. Underfill 116 may include, for example, a resin material that is configured to help adhere IC die 102 to substrate 104. Underfill 116 may be injected between IC die 102 and substrate 104 in a flowable state and subsequently cured. In some embodiments, underfill 116 may, at least partially extend beyond the periphery of IC die 102 and form a surrounding fillet that extends towards pillars 204.

Figure 3C:
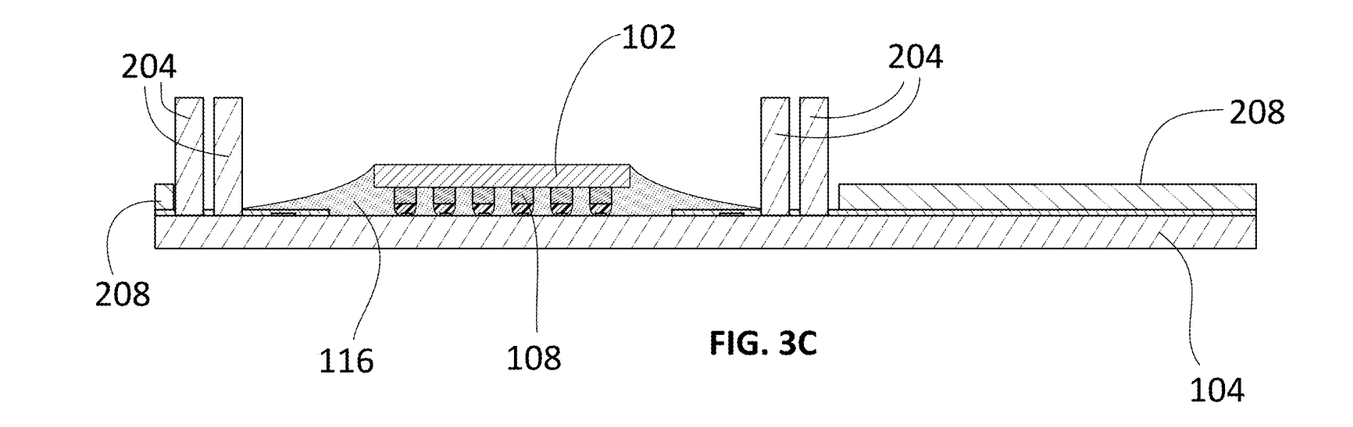

In some embodiments, as shown in FIG. 3C, a mask 208 is applied to one or more portions of substrate 104. In some embodiments, mask 208 is applied to protect portions of substrate 104 that should not be covered by first heat-conducting layer 202. For example, mask 208 may be applied to portions of substrate 104 where first heat-conducting layer 202 could interfere with the placement of other semiconductor devices (e.g., NAND dies). In some embodiments, pillars 204 are position on a region of substrate 104 located between the areas covered by mask 208 and IC die 102. Mask 208 may be applied after pillars 204 and/or IC die 102 have been mounted to substrate 104. Alternatively, mask 208 may be applied before pillars 204 and/or IC die 102 are mounted to substrate 104. In some embodiments, mask 208 is a removable film, sheet, or coating. In some embodiments, mask 208 is a polymer film, sheet, or coating that is removably applied to substrate 104 such that mask 208 can be subsequently removed from substrate 104. In some embodiments, mask 208 is or includes a mask tape (e.g., an acrylic mask tape) or a thermal release film. In some examples, mask 208 may have a thickness of up to 100 μm.

Figure 3D:
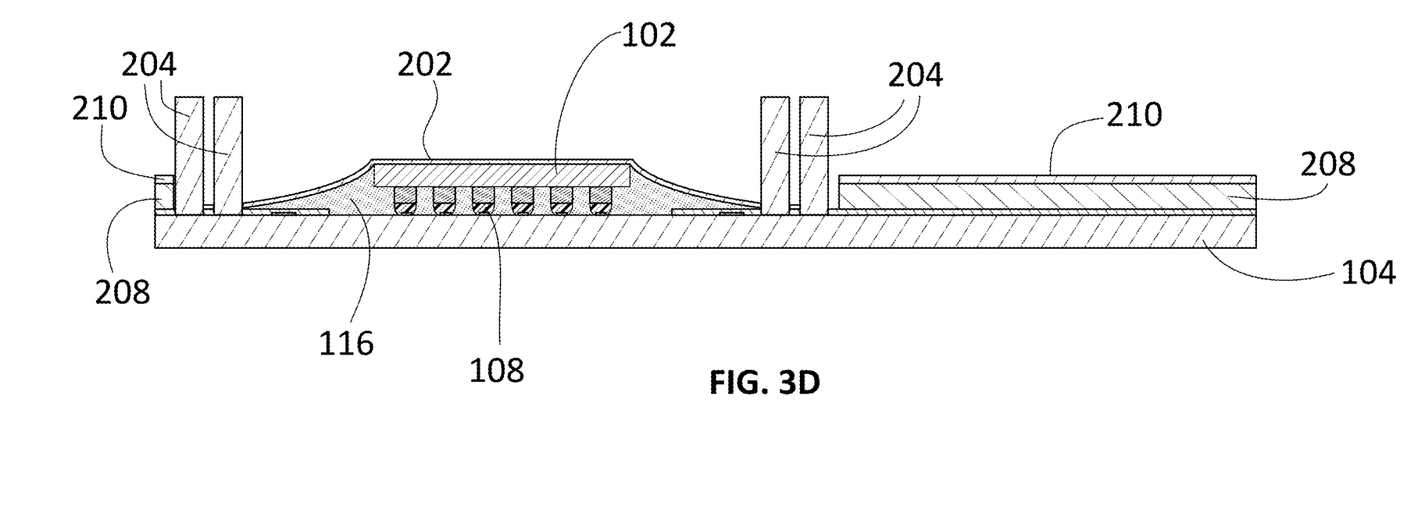
Figure 3E:
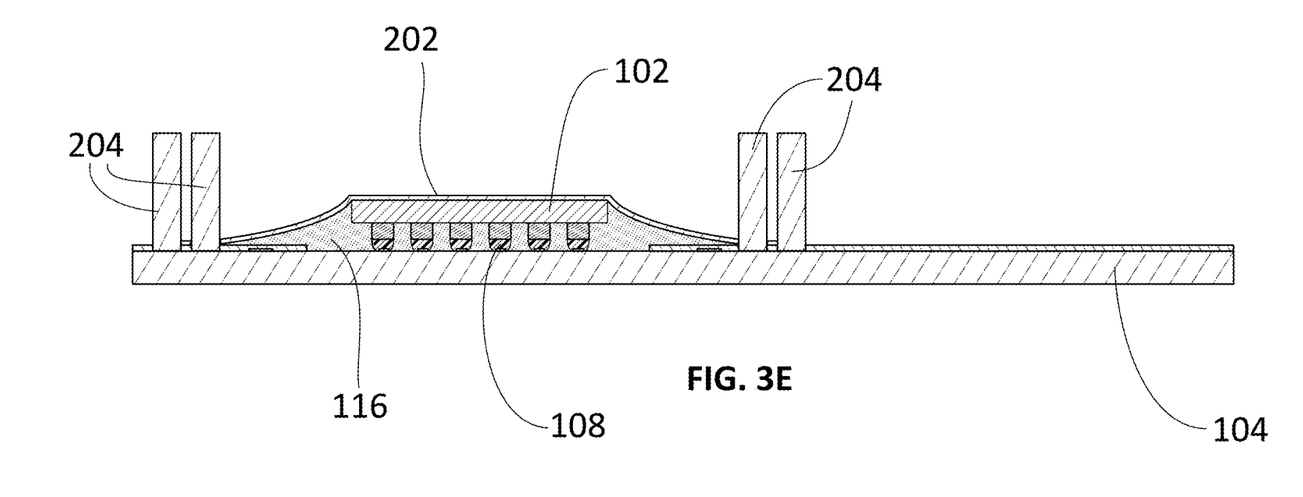

After IC die 102 has been mounted to substrate 104 and mask 208 has been added, first heat-conducting layer 202 may be applied, as shown in FIG. 3D. In some embodiments, first heat-conducting layer 202 is applied by a first sputtering process or other physical/chemical vapor deposition process. In other embodiments, first heat-conducting layer 202 may be formed by an electroplating process. In some embodiments, copper or other thermally conductive material discussed above, is deposited to form a layer over substrate 104 and the components mounted to substrate 104. The layer of thermally conductive material may be up to 20 μm in thickness, according to some embodiments, for example from about 3 μm to about 10 μm. The copper or other thermally conductive material may be deposited directly onto IC die 102 and underfill 116 such that first heat-conducting layer 202 is formed directly on surfaces of these components. The deposited layer is also applied to pillars 204, according to some embodiments, such that first heat-conducting layer 202 extends from IC die 102 to pillars 204. In some embodiments, an excess portion of the copper or other thermally conductive material may further be deposited on mask 208, illustrated as excess layer 210. Excess layer 210 may be removed by removing mask 208 from substrate 104. For example, mask 208 with excess layer 210 may be peeled away from substrate 104 following the deposition process.

Figure 3F:
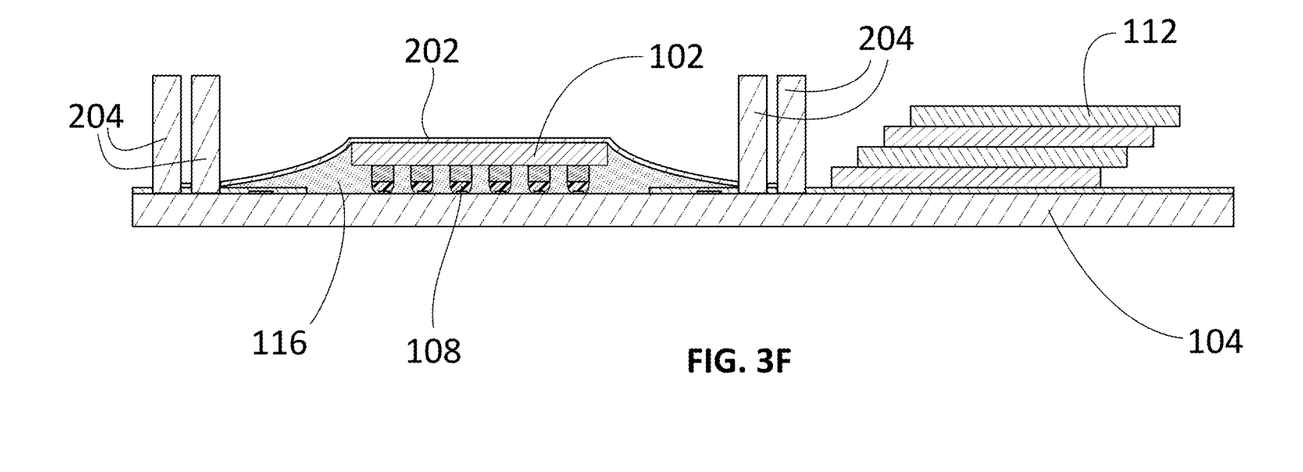
Figure 3G:
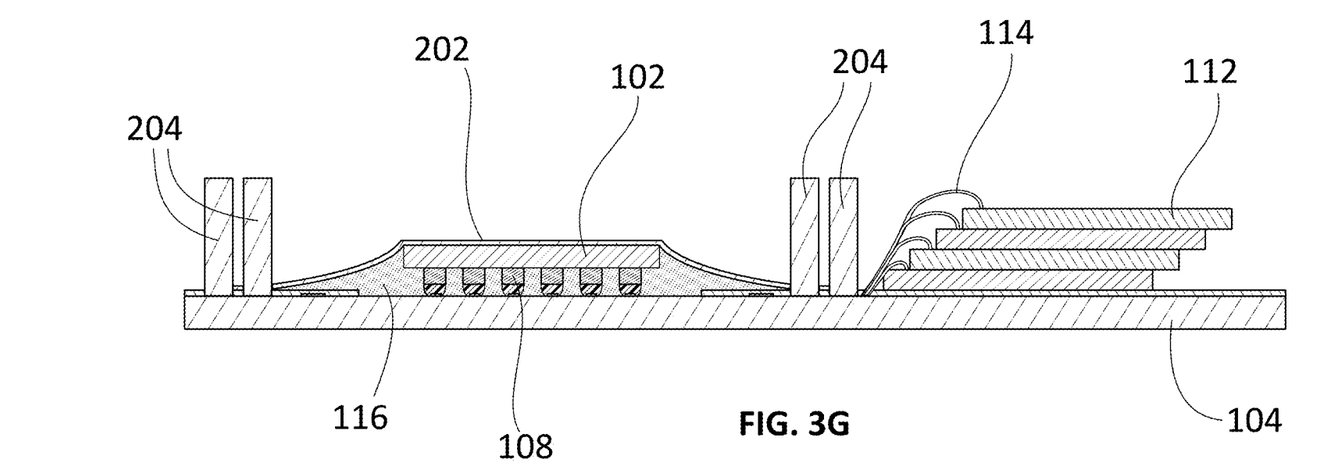

After mask 208 and excess layer 210 have been removed (FIG. 3E), one or more additional components may be added onto substrate 104 at a location formerly covered by mask 208. As shown in FIG. 3F, for example, the one or more additional components may include one or more NAND dies 112 or other semiconductor devices. In some embodiments, NAND dies 112 are positioned such that one or more pillars 204 may be located on substrate 104 between IC die 102 and NAND dies 112. Following positioning of NAND dies 112 on substrate 104, NAND dies 112 may be electrically connected to circuitry on substrate 104 by, for example, connecting wires 114 (FIG. 3G).

Figure 3H:
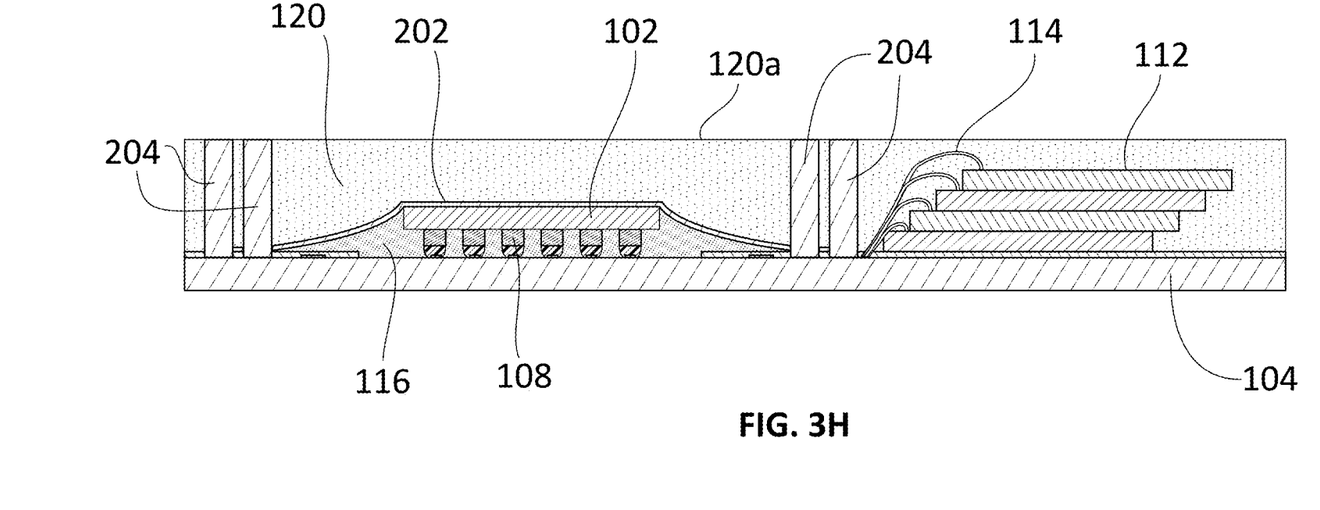

Referring now to FIG. 3H, components on substrate 104 are encapsulated by encapsulant 120. As discussed, encapsulant 120 surrounds one or more components on substrate 104. Encapsulant 120 may include, for example, a ceramic, glass, thermoplastic, thermoset resin, or composite thereof. In some examples, encapsulant 120 is an EMC or other encapsulating material that is molded and cured around IC die 102, underfill material 116, NAND dies 112, connecting wires 114, and/or other components on substrate 104. In some embodiments, encapsulant 120 is deposited over first heat-conducting layer 202 such that first heat-conducting layer 202 is disposed between IC die 102 and encapsulant 120. In some embodiments, first heat-conducting layer 202 is also disposed between underfill material 116 and encapsulant 120.

Figure 3I:
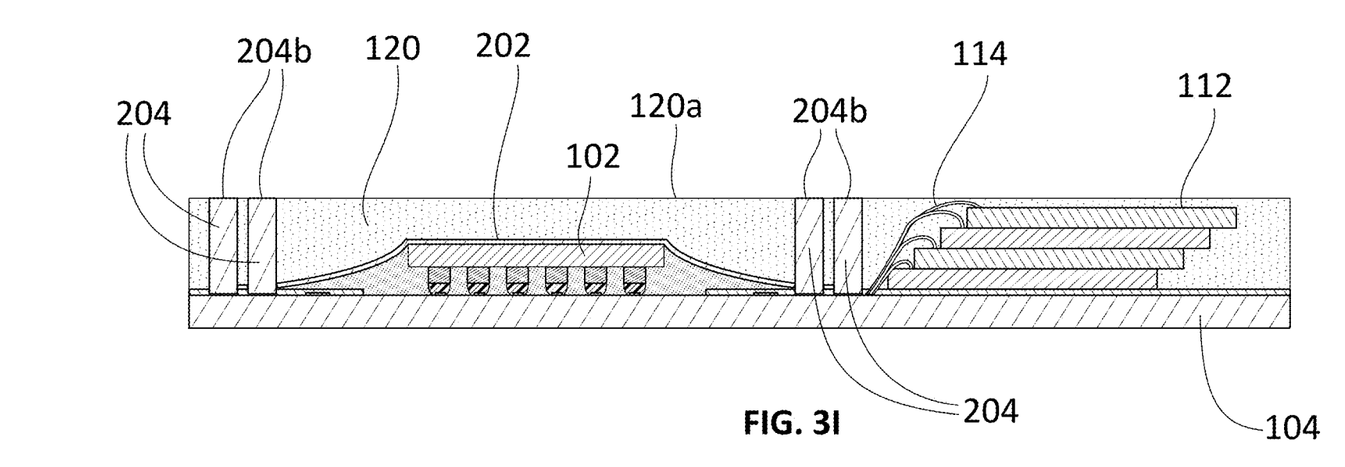

Encapsulant 120 further surrounds pillars 204 according to some embodiments. Following encapsulation, top surface 120a of encapsulant 120 may be polished. In some embodiments, top surface 120a is polished in order to expose second ends 204b of pillars 204 (FIG. 3I). In some embodiments, polishing removes a thin surface layer of encapsulant 120 from top surface 120a and may be achieved, for example, using an abrasive. In other embodiments, the thin surface layer of encapsulant 120 may be removed by etching, machining, or cutting. In some embodiments, second ends 204b of pillars 204 are flush with top surface 120a of encapsulant 120. In other embodiments, second ends 204b of pillars 204 may protrude out of top surface 120a.

Figure 3J:
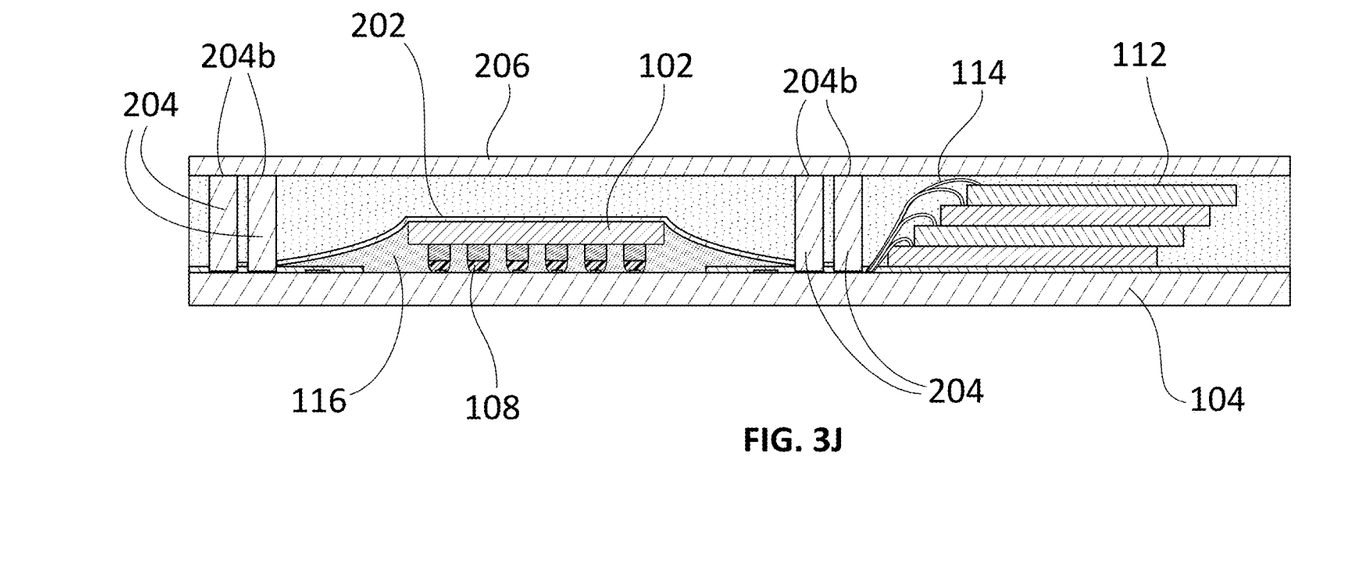

Referring now to FIG. 3J, second heat-conducting layer 206 is applied onto an outer surface of encapsulant 120. In some embodiments, second heat-conducting layer 206 is applied onto at least top surface 120a of encapsulant 120. In further embodiments, second heat-conducting layer 206 may also be applied to one or more lateral sides of encapsulant 120 (not illustrated). In some embodiments, second heat-conducting layer 206 covers at least 50% of top surface 120a of encapsulant 120. In some embodiments, second heat-conducting layer 206 covers the entire top surface 120a of encapsulant 120. In some embodiments, second heat-conducting layer 206 is applied by a second sputtering process or other physical/chemical vapor deposition process. For example, in some embodiments, copper or other thermally conductive material discussed above, is deposited to form a layer over at least a portion of top surface 120a of encapsulant 120. In some embodiments, second heat-conducting layer 206 is formed over the exposed second ends 204b of pillars 204. In some embodiments, second heat-conducting layer 206 is configured to be in direct contact with second ends 204b of pillars 204. In further embodiments, at least a portion of encapsulant 120 is disposed between first heat-conducting layer 202 and second heat-conducting layer 206. The portion of encapsulant 120 that is disposed between first heat-conducting layer 202 and second heat-conducting layer 206 may be bordered by pillars 204 according to some embodiments.

Figure 4:
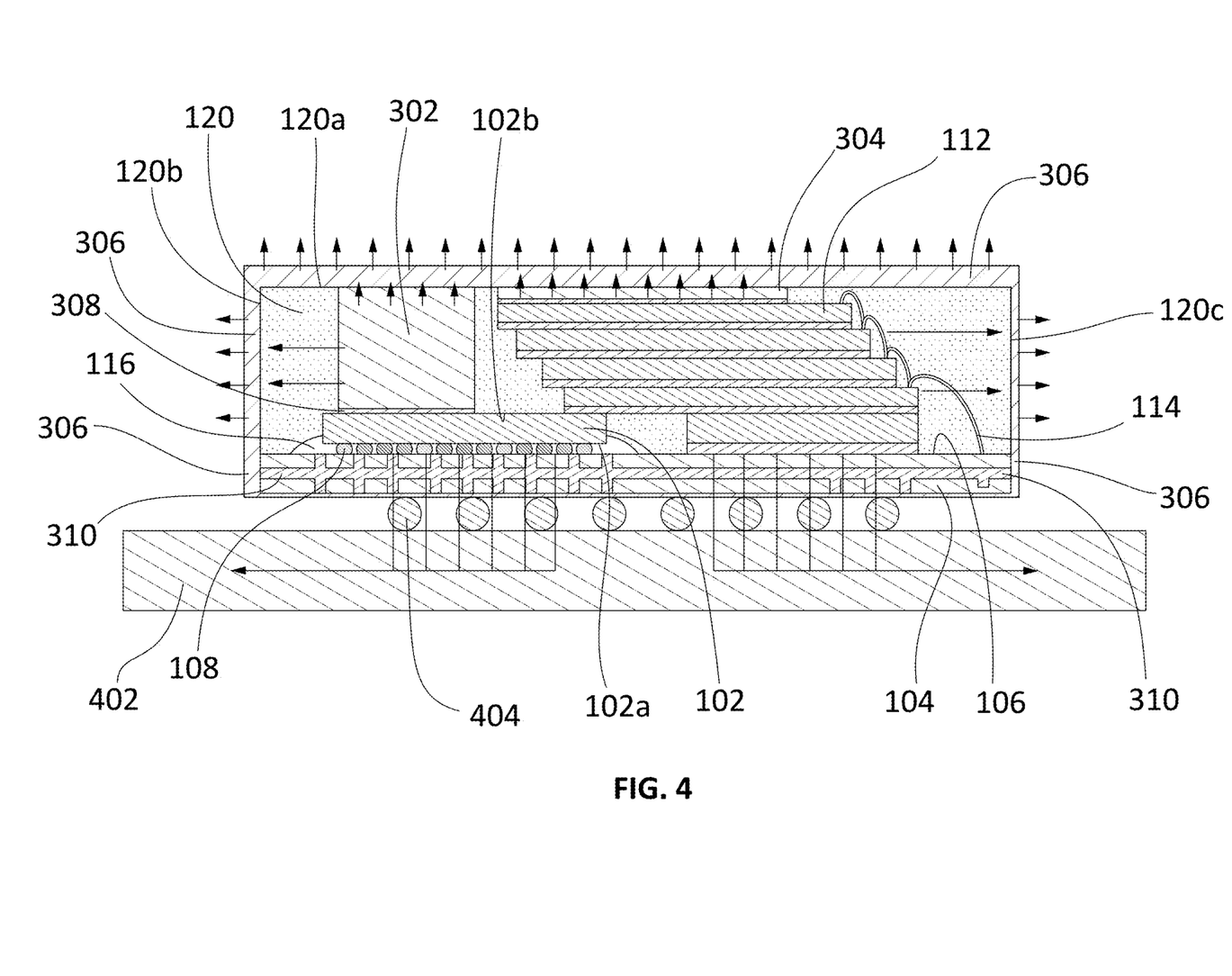
FIG. 4 is an enlarged cross-sectional side view of a portion of a semiconductor device package according to further embodiments of the present disclosure having thermally conductive spacers for dissipating heat from a heat-generating component.

FIG. 4 a semiconductor device package 300 according to further embodiments of the present disclosure. Semiconductor device package 300, in some embodiments, may have certain components that are similar to components of semiconductor device packages 100 or 200 described previously. For example, in certain embodiments semiconductor device package 300 includes at least one heat-generating component, e.g., IC die 102 (e.g., a flip-chip die), one or more NAND dies 112, and/or other chips, that are positioned on surface 106 of substrate 104. IC die 102, for example, may be an ASIC die (e.g., a control die) and is configured to send/receive signals to/from NAND dies 112 by way of the substrate. IC die 102 may include an active side 102a that is positioned to face substrate 104, and a back side 102b that is opposite of active side 102a and faces away from substrate 104. Semiconductor device package 300 further includes an encapsulant 120 that at least partially surrounds the one or more heat-generating components. In some embodiments, semiconductor device package 300 may further include underfill material 116 that is configured to adhere IC die 102 to substrate 104, and connecting wires 114 for connecting NAND dies 112 to electrical contacts (e.g., gold fingers).

In some embodiments, IC die 102 of semiconductor device package 300 may be an embedded die, or a partially embedded die, wherein the one or more NAND dies 112 are stacked, at least partially, over IC die 102. In some embodiments, NAND dies 112 are partially positioned on and cover a portion of back side 102b of IC die 102. Such a configuration, according to some embodiments, allows semiconductor device package 300 to have a smaller footprint size.

In some embodiments, semiconductor device package 300 includes a first heat-conducting spacer 302. In some embodiments, first heat-conducting spacer 302 is positioned on back side 102b of IC die 102 and is configured to conduct heat away from back side 102b of IC die 102. In some embodiments, first heat-conducting spacer 302 is positioned on a portion of back side 102b that is not covered by NAND dies 112. In some embodiments, first heat-conducting spacer 302 is dimensioned to extend from back side 102b of IC die 102 to an outer surface of encapsulant 120, for example, top surface 120a of encapsulant 120. In some embodiments, first heat-conducting spacer 302 may be affixed to back side 102b of IC die 102, for example, using an adhesive material 308 that is disposed between first heat-conducting spacer 302 and back side 102b of IC die 102. The adhesive material may be a die attach film (DAF) according to some examples.

In some embodiments, semiconductor device package 300 further includes a second heat-conducting spacer 304. In some embodiments, first heat-conducting spacer 302 is positioned on one or more NAND dies 112 and is configured to conduct heat away from NAND dies 112. In some embodiments, second heat-conducting spacer 304 is dimensioned to extend from NAND dies 112 to an outer surface of encapsulant 120, for example, top surface 120a of encapsulant 120. In some embodiments, second heat-conducting spacer 304 may be affixed to NAND dies 112, for example, using an adhesive material (e.g., DAF) that is disposed between second heat-conducting spacer 304 and a surface of NAND dies 112.

In some embodiments, semiconductor device package 300 includes a includes a heat-conducting layer 306. In some embodiments, heat-conducting layer 306 is positioned and configured to dissipate heat to the environment surrounding semiconductor device package 300. In some such embodiments, heat-conducting layer 306 may have one or more surfaces that are exposed to the surrounding environment. In some embodiments, heat-conducting layer 306 is disposed on an outer surface of encapsulant 120, for example, top surface 120a of encapsulant 120. In some embodiments, a majority (e.g., at least 50%) of top surface 120a of encapsulant 120 is covered by heat-conducting layer 306. In some embodiments, the entirety of top surface 120a of encapsulant 120 is covered by heat-conducting layer 306. As illustrated, heat-conducting layer 306 may also be disposed along one or more lateral sides 120b, 120c of encapsulant 120. In some embodiments, heat-conducting layer 306 extends along one or more lateral sides 120b, 120c to substrate 104. In some embodiments, heat-conducting layer 306 may be formed by sputtering a thermally conductive material (e.g., copper or other metal) over an outer surface of encapsulant 120, for example, top surface 120a. Other physical or chemical vapor deposition processes may also be used to form heat-conducting layer 306. In some examples, a thickness of heat-conducting layer 306 may range from about 50 μm to about 1000 μm.

In some embodiments, first heat-conducting spacer 302 and/or second heat-conducting spacer 304, preferably both, are in contact with heat-conducting layer 306. In some embodiments, first heat-conducting spacer 302 is positioned between IC die 102 and heat-conducting layer 306 such that heat may be transferred from IC die 102 (e.g., from back side 102b), through first heat-conducting spacer 302, to heat-conducting layer 306. In some embodiments, second heat-conducting spacer 304 is positioned between NAND dies 112 and heat-conducting layer 306 such that heat may be transferred from NAND dies 112, through second heat-conducting spacer 304, to heat-conducting layer 306. In some embodiments, heat transferred to heat-conducting layer 306 from first heat-conducting spacer 302 and/or second heat-conducting spacer 302 may, in turn, be released to the environment surrounding semiconductor device package 300.

In some embodiments, first heat-conducting spacer 302 and/or second heat-conducting spacer 304 and heat-conducting layer 306 together form a passive, first thermal pathway to quickly dissipate heat away from the heat-generating components (e.g., IC die 102, NAND dies 112) to the outside environment. In some embodiments, this first thermal pathway may be particularly configured to conduct heat away from back side 102a of IC die 102. The direction of heat transfer according to some embodiments is represented by the arrows shown in FIG. 4. During operation of semiconductor device package 300, for example, at least a portion of heat generated by IC die 102 may exit IC die 102 through back side 102b. This heat may be transferred to first heat-conducting spacer 302, which in some embodiments is positioned on at least a portion of back side 102b. The heat transferred to first heat-conducting spacer 302 may in turn be conducted to heat-conducting layer 306, and dissipated to the surrounding environment. Likewise, in some embodiments, at least a portion of heat generated by NAND dies 112 may be transferred to second heat-conducting spacer 304, and in turn transferred to heat-conducting layer 306 and dissipated to the surrounding environment.

First heat-conducting spacer 302, second heat-conducting spacer 304, and heat-conducting layer 306 may be made from one or more thermally conductive materials selected to have a thermal conductivity that is greater than the thermally conductivity of encapsulant 120. First heat-conducting spacer 302, second heat-conducting spacer 304, and heat-conducting layer 306 may be made from the same thermally conductive material or each may be made from different thermally conductive materials. In some embodiments, the one or more thermally conductive materials that are used in first heat-conducting spacer 302, second heat-conducting spacer 304, and heat-conducting layer 306 may be selected to have a thermal conductivity that is at least 10 to at least 100 times greater than the thermally conductivity of encapsulant 120, preferably at least 100 to at least 500 times greater than the thermally conductivity of encapsulant 120. For example, in some embodiments, encapsulant 120 may have a thermal conductivity of less than 1 W/m·K to about 10 W/m·K, whereas the one or more thermally conductive materials of first heat-conducting spacer 302, second heat-conducting spacer 304, and heat-conducting layer 306 may have a thermal conductivity at least or greater than the thermal conductivity of pure silicon, which is approximately 147 W/m·K. In some embodiments, first heat-conducting spacer 302, second heat-conducting spacer 304, and heat-conducting layer 306 may be made from one or more thermally conductive materials that have a thermal conductivity within a range of about 100 W/m·K to about 600 W/m·K, for example, about 300 W/m·K to about 500 W/m·K.

In some embodiments, the one or more thermally conductive materials of first heat-conducting spacer 302, second heat-conducting spacer 304, and heat-conducting layer 306 includes or consists of a pure metal or metal alloy. In some embodiments, the one or more thermally conductive materials includes or consists of pure copper or a copper alloy, for example. The copper or copper alloy may have a thermal conductivity greater than 300 W/m·K (e.g., about 397 W/m·K). In some embodiments, the one or more thermally conductive materials includes or consists of aluminum or an aluminum alloy. In some embodiments, the one or more thermally conductive materials includes or consists of a precious metal or alloy thereof (e.g., silver or gold). In some embodiments, the one or more thermally conductive materials includes or consists of silicon. In other embodiments the one or more thermally conductive materials includes or consists of a non-metallic material preferably having a thermal conductivity that is at least or greater than 100

W/m·K. In some embodiments, the one or more thermally conductive materials includes or consists of graphene, carbon nanotubes, diamond, and/or other forms of carbon. In some embodiments, for example, first heat-conducting spacer 302 and/or second heat-conducting spacer 304 may be pure silicon, while heat-conducting layer 306 is copper or a copper alloy.

In some embodiments, at least a portion of the heat generated by IC die 102 may also be transferred to substrate 104 in a second thermal pathway. In some such embodiments, for example, heat may be transferred to substrate 104 from IC die 102 through the one or more solder joints 108 that connect IC die 102 to substrate 104. In some such embodiments, this passive, second thermal pathway is configured to conduct heat away from active side 102a of IC die 102. In some embodiments, substrate 104 may include one or more thermally conductive traces 310 for conducting heat received from IC die 102. Thermally conductive traces 310, for example, may be made of copper or other thermally conductive material that is disposed on or within substrate 104. In some embodiments, thermally conductive traces 310 may extend to one or more edges of substrate 104. In some embodiments, thermally conductive traces 310 may contact a portion of heat-conducting layer 306. In some embodiments, at least a portion of heat transferred to substrate 104 from IC die 102 may in turn be transferred, via thermally conductive traces 310, to heat-conducting layer 306 and dissipated to the surrounding environment.

In further embodiments, a portion of heat from substrate 104 may be conducted to a second substrate 402. Substrate 402 may be, for example, a separate PCB. In some embodiments, semiconductor device package 300 may be connected to substrate 402 via solder joints 404 disposed between substrate 104 and substrate 402. In some embodiments, a portion of heat from substrate 104 may be conducted through solder joints 404 to substrate 402.

It should be understood that various changes, substitutions, and alterations can be made herein without departing from the spirit and scope of the invention as defined by the appended claims. It should also be apparent that individual elements identified herein as belonging to a particular embodiment may be included in other embodiments of the invention. Moreover, the scope of the present application is not intended to be limited to the particular embodiments of the process, machine, manufacture, and composition of matter, means, methods and steps described in the specification. The scope of the invention also is not meant to be limited by the title or the abstract, as these parts of the application are provided to facilitate searching specific features disclosed herein. As one of ordinary skill in the art will readily appreciate from the disclosure, processes, machines, manufacture, composition of matter, means, methods, or steps, presently existing or later to be developed that perform substantially the same function or achieve substantially the same result as the corresponding embodiments described herein may be used according to the present disclosure.

What is claimed is:

1. A semiconductor device package, comprising:
   a substrate;
   a heat-generating component positioned on a surface of the substrate, the heat-generating component including contacts configured to make electrical contact with the substrate;
   an encapsulant at least partially covering the heat-generating component, the encapsulant having an outer surface;
   a first heat-conducting, the first heat-conducting layer being electrically conductive and disposed between the encapsulant and the first heat-generating component; and
   one or more pillars in contact with the first heat-conducting layer, the one or more pillars extending to the outer surface of the encapsulant.

2. The semiconductor device package of claim 1, further comprising a second heat-conducting layer on the outer surface of the encapsulant, wherein at least a portion of the encapsulant is disposed between the first heat-conducting layer and the second heat-conducting layer.

3. The semiconductor device package of claim 2, wherein the first heat-conducting layer, the second heat-conducting layer, and the one or more pillars each comprises a material having a thermal conductivity that is at least 147 W/m·K.

4. The semiconductor device package of claim 2, wherein the one or more pillars are in contact with the second heat-conducting layer.

5. The semiconductor device package of claim 4, wherein the one or more pillars extend through the encapsulant from the first heat-conducting layer to the second heat-conducting layer.

6. The semiconductor device package of claim 1, wherein the one or more pillars are positioned on the substrate and spaced from the heat-generating component.

7. The semiconductor device package of claim 6, further comprising an underfill material disposed on the substrate between the one or more pillars and the heat-generating component.

8. The semiconductor device package of claim 7, wherein the first heat-conducting layer is disposed between the underfill material and the encapsulant.

9. The semiconductor device package of claim 8, wherein the first heat-generating component comprises an integrated circuit die having an active side facing the substrate and a back side opposite the active side, and wherein the first heat-conducting layer is disposed directly on the back side of the integrated circuit die and the underfill material.

10. The semiconductor device package of claim 9, further comprising one or more NAND dies, wherein at least one of the one or more pillars is positioned between the one or more NAND dies and the integrated circuit die.

11. The semiconductor device package of claim 10, further comprising a second heat-conducting layer formed on the outer surface of the encapsulant, wherein one or more pillars extend from the surface of the substrate to the second heat-conducting layer.

12. The semiconductor device package of claim 11, wherein the first and second heat-conducting layers and the one or more pillars comprise copper.

13. A semiconductor device package, comprising:
   a substrate;
   a first heat-generating component positioned on a surface of the substrate, the first heat-generating component including an active side having contacts configured to make electrical contact with the substrate and a back side opposite the active side;
   one or more second heat-generating components positioned laterally adjacent to the first heat-generating component;
   an encapsulant at least partially covering the first heat-generating component and the one or more second heat-generating components, the encapsulant having an outer surface;

a heat-conducting layer disposed on a top and two lateral side surfaces of the outer surface of the encapsulant; and a first heat-conducting spacer positioned on the back side of the first heat-generating component, the first heat-conducting spacer extending to the outer surface of the encapsulant and contacting the heat-conducting layer.

14. The semiconductor device package of claim 13, further comprising a second heat-conducting spacer, the second heat-conducting spacer positioned between the one or more second heat-generating components and the heat-conducting layer, wherein the second heat-conducting spacer extends to the outer surface of the encapsulant and contacts the heat-conducting layer.

15. The semiconductor device package of claim 14, wherein the first heat-conducting spacer and/or the second heat-conducting spacer are made of silicon.

16. The semiconductor device package of claim 15, wherein the substrate includes one or more thermally conductive traces, at least one of the one or more thermally conductive traces being in contact with the heat-conducting layer.

17. The semiconductor device package of claim 16, wherein the first heat-generating component comprises a control die and the one or more second heat-generating components comprise one or more NAND dies stacked one upon another, wherein the control die is in communication with the one or more NAND dies by way of the substrate.

18. A semiconductor device package, comprising:
a substrate means for providing electrical interconnections;
an integrated circuit die attached to a surface of the substrate means, wherein the integrated circuit die includes contact means for electrically connecting the integrated circuit die with the substrate means;
an encapsulation means for at least partially encapsulating the integrated circuit die;
a heat dissipation means sputtered onto a top and lateral side surfaces of the encapsulation means for dissipating heat generated by the integrated circuit die from the semiconductor device package to a surrounding environment;
a first heat conduction means, the first heat conduction means being electrically conductive and at least partially disposed on a surface of the integrated circuit die; and
a second heat conduction means in communication with the first heat conduction means for conducting the heat generated by the integrated circuit die to the heat dissipation means.

19. The semiconductor device package of claim 18, wherein the first heat conduction means comprises a heat-conductive layer disposed between the integrated circuit die and the encapsulation means, and one or more pillar means for conducting heat from the heat-conductive layer to the heat dissipation means.

20. The semiconductor device package of claim 18, wherein the first heat conduction means comprises a heat-conductive spacer in contact with the heat dissipation means, the heat-conductive spacer being positioned between the integrated circuit die and the heat dissipation means.

* * * * *